United States Patent
Secord et al.

(10) Patent No.: US 6,936,410 B2
(45) Date of Patent: Aug. 30, 2005

(54) MARKING SUBSTRATES

(75) Inventors: Michael P. Secord, West Chesterfield, NH (US); Richard J Larson, Jr., Walpole, NH (US)

(73) Assignee: Markem Corporation, Keene, NH (US)

( * ) Notice: Subject to any disclaimer, the term of this patent is extended or adjusted under 35 U.S.C. 154(b) by 265 days.

(21) Appl. No.: 10/376,365

(22) Filed: Feb. 28, 2003

(65) Prior Publication Data

US 2003/0194507 A1 Oct. 16, 2003

Related U.S. Application Data

(60) Provisional application No. 60/360,931, filed on Mar. 1, 2002.

(51) Int. Cl.$^7$ .............................................. B41M 5/26
(52) U.S. Cl. ....................... 430/346; 430/21; 430/945
(58) Field of Search ............................ 430/21, 346, 945

(56) References Cited

U.S. PATENT DOCUMENTS 5,667,580 A * 9/1997 Babler ........................ 106/499
6,503,310 B1 * 1/2003 Sullivan ..................... 106/31.6

FOREIGN PATENT DOCUMENTS

JP      1-215589 A * 8/1989
JP      01-215589     8/1998

OTHER PUBLICATIONS

PCT Search Report dated Jul. 9, 2003.

* cited by examiner

Primary Examiner—John A. McPherson
(74) Attorney, Agent, or Firm—Fish & Richardson P.C.

(57) ABSTRACT

A method of marking a substrate includes contacting the substrate with a composition and contacting the composition with energy sufficient to produce a change in the composition that can be detected optically. In some embodiments, the change produces a white mark.

36 Claims, No Drawings

MARKING SUBSTRATES

CLAIM OF PRIORITY

This application claims priority under 35 USC § 119(e) to U.S. Provisional Patent Application Ser. No. 60/360,931, filed on Mar. 1, 2002, the entire contents of which are hereby incorporated by reference.

BACKGROUND

This invention relates to marking substrates.

One technique for marking substrates is known as laser marking. In laser marking, radiation is directed onto a substrate to modify the substrate, or a coating on the substrate, in a way that induces a change in the substrate or the coating that can be detected optically. The radiation can be directed, or addressed, in a pattern over the substrate such that a desired indicia or image is rendered.

SUMMARY

The invention relates to marking substrates. For example, the substrate can be a coating, such as a laser sensitive coating, that can be applied on a printed circuit board, for marking indicia such as date codes, identification numbers, logos, promotional indicia, graphics, and sell by dates. In addition, the substrate can also be used for identification of parts, such as automotive parts, aerospace parts, saw blades, and other mechanical parts.

In one aspect, the invention features a method of marking a substrate including contacting the substrate with a composition having a material with a substructure

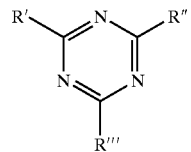

and contacting the composition with energy sufficient to produce a change in the composition that can be detected optically, wherein each of R', R", and R''' is independently selected from the group consisting of hydroxyl, a substituted or unsubstituted (C1–C10) alkyl, a substituted or unsubstituted (C1–C10) hydroxyalkyl, a substituted or unsubstituted (C1–C10) alkyloxy, a substituted or unsubstituted (C1–C10) alkyloxy-(C1–C10) alkyl, a substituted or unsubstituted (C1–C10) alkylamino-(C1–C10) alkyl, a substituted or unsubstituted (C1–C10) aminoalkyl, a substituted or unsubstituted aryl, a substituted or unsubstituted (C1–C10) hydroxyaryl, a substituted or unsubstituted (C1–C10) aryloxy, a substituted or unsubstituted (C1–C10) aminoaryl, a substituted or unsubstituted arylalkyl, a substituted or unsubstituted C1–C10 haloalkyl, a substituted or unsubstituted C2–C6 alkenyl, a substituted or unsubstituted C2–C6 alkynyl, oxo, a substituted or unsubstituted (C1–C10) aminoalkyloxy, a substituted or unsubstituted (C1–C10) aminoalkylcarboxy, a substituted or unsubstituted aminoalkylaminocarbonyl, a substituted or unsubstituted (C1–C10) aminoalkylcarboxamido, or a substituted or unsubstituted (C1–C4)alkylacetamide(C1–C4)alkyloxy(C1–C4)alkyl.

In another aspect, the invention features a method of marking a substrate including contacting the substrate with a composition having a material with a substructure

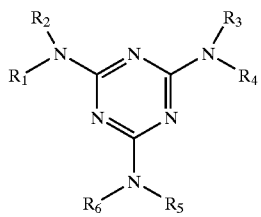

and contacting the composition with energy sufficient to produce a change in the composition that can be detected optically, wherein each of $R_1$ through $R_6$ is independently selected from the group consisting of hydrogen, hydroxyl, a substituted or unsubstituted (C1–C10) alkyl, a substituted or unsubstituted (C1–C10) hydroxyalkyl, a substituted or unsubstituted (C1–C10) alkyloxy, a substituted or unsubstituted (C1–C10) alkyloxy-(C1–C10) alkyl, a substituted or unsubstituted (C1–C10) alkylamino-(C1–C10) alkyl, a substituted or unsubstituted (C1–C10) aminoalkyl, a substituted or unsubstituted aryl, a substituted or unsubstituted (C1–C10) hydroxyaryl, a substituted or unsubstituted (C1–C10) aryloxy, a substituted or unsubstituted (C1–C10) aminoaryl, a substituted or unsubstituted arylalkyl, a substituted or unsubstituted C1–C10 haloalkyl, a substituted or unsubstituted C2–C6 alkenyl, a substituted or unsubstituted C2–C6 alkynyl, oxo, a substituted or unsubstituted (C1–C10) aminoalkyloxy, a substituted or unsubstituted (C1–C10) aminoalkylcarboxy, a substituted or unsubstituted (C1–C10) aminoalkylaminocarbonyl, a substituted or unsubstituted (C1–C10) aminoalkylcarboxamido, or a substituted or unsubstituted (C1–C4)alkylacetamide(C1–C4)alkyloxy(C1–C4)alkyl.

Embodiments of the aspects of the invention may include one or more of the following features. The composition includes a crosslinking agent, a catalyst, a surfactant, and/or a pigment. The method further includes heating the composition (e.g., to cure the composition). The energy is delivered from a laser. The composition includes a polyol. The composition produces a white mark after energy is contacted. The method includes heating the composition, and addressing the composition (e.g., the cured composition) with a laser to produce a mark, e.g., a white mark.

The term "unsubstituted" used herein refers to a moiety having each atom hydrogenated such that the valency of each atom is filled.

The term "halo" used herein refers to a halogen atom such as fluorine, chlorine, bromine, or iodine.

An alkyl group is a branched or unbranched hydrocarbon that may be substituted or unsubstituted. Examples of branched alkyl groups include isopropyl, sec-butyl, isobutyl, tert-butyl, sec-pentyl, isopentyl, tert-pentyl, isohexyl. Substituted alkyl groups may have one, two, three or more substituents, which may be the same or different, each replacing a hydrogen atom. Substituents are halogen (e.g., F, Cl, Br, and I), hydroxyl, hydroxyl, amino, protected amino, carboxy, protected carboxy, cyano, methylsulfonylamino, alkoxy, acyloxy, nitro, lower haloalkyl, and their chemically protected (e.g., blocked) forms when applicable.

The term "substituted" used herein refers to moieties having one, two, three or more substituents, which may be the same or different, each replacing a hydrogen atom. Examples of substituents include but are not limited to halogen (e.g., F, Cl, Br, and I), hydroxyl, protected hydroxyl, amino, protected amino, carboxy, protected carboxy, cyano, methylsulfonylamino, alkoxy, alkyl, aryl, aralkyl, acyloxy, nitro, and lower haloalkyl.

An aryl group is a $C_{6-20}$ aromatic ring, wherein the ring is made of carbon atoms (e.g., $C_{6-14}$, $C_{6-10}$ aryl groups). Examples of aryl groups include phenyl, naphthyl, indenyl, naphthalenyl, phenanthrenyl, and anthracenyl. Examples of haloalkyl include fluoromethyl, dichloromethyl, trifluoromethyl, 1,1-difluoroethyl, and 2,2-dibromoethyl.

An arylalkyl group is a group containing 6–20 carbon atoms that has at least one aryl ring and at least one alkyl or alkylene chain connected to that ring. An example of an arylalkyl group is a benzyl group.

Embodiments may include one or more of the following advantages. The coatings may adhere strongly to a wide variety of substrate materials, for example, metals, such as aluminum, tin, or stainless steel, as well as glass, paper, and packaging film (e.g., those that can be heated to crosslinking temperatures, such as about 150° C. or higher). The coating does not fracture or flake off the substrate. The coating is resistant to thermal shock degradation. In some applications, after applying the coating to the substrate, the substrate may be marked in a production environment, e.g., one having relatively high line speed and a relatively fast rate of imaging.

The coating is stable until imaged, i.e., there is a relatively long shelf life without substantial contrast development or discoloration until a laser addresses the coating. The coating is also stable at relatively high temperatures, e.g., 200° C. minimum without substantial discoloration or visual degradation, e.g., a color shift. The coating can be delivered from an environmentally friendly solvent, followed by evaporation of the solvent. By adjusting the rheological properties of the coating fluid, various application methods can be used. Such methods include, for example, spraying, lithographic pressing, and reciprocal pad printing. The applied coating can be cured by thermal treatment, e.g., at 200° C. in a relatively short time.

DETAILED DESCRIPTION OF THE PREFERRED EMBODIMENTS

Prior to marking a substrate, e.g., with a laser, the substrate is treated, e.g., coated, with an imaging fluid, e.g., to form a polymeric coating. The imaging fluid generally includes a resin, such as a melamine, dissolved in a solvent, such as water. The imaging fluid can further include a crosslinking agent, a catalyst, and/or one or more other additives, such as a pigment and/or a surfactant. In some embodiments, the coating is heated to cure or crosslink one or more materials in the coating, and/or to remove at least a portion of the solvent. The coating can be marked by contacting the coating with energy, such as energy from a laser, to form a mark.

Resin: The resin is selected such that the coating can form a mark of a select color, such as opaque white, for example, when the coating is addressed with a laser. Selection of the resin can also be based on the coating application method, adhesion requirements, and/or environmental durability requirements. The resin can be essentially colorless in the visible range but absorbs in the wavelengths, e.g., infrared produced by a laser, e.g., a $CO_2$ laser. In certain embodiments, when heated and/or with the addition of an active crosslinking agent or catalyst, as described below, the resin can polymerize, e.g., via a condensation mechanism, at reaction rates required for some laser marking applications, such as manufacturing of mechanical parts. In some embodiments, the resin can polymerize in less than about 60 min (e.g., <30 min, <15 min, <10 min, <5 min, <2 min, or <1 min).

In preferred embodiments, the resin includes a material, e.g., a monomer, having the following substructure (I):

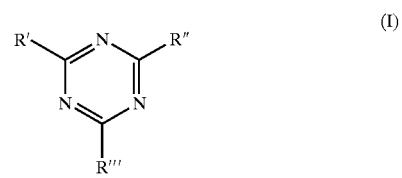

where the R', R", and R'" groups independently can be all different, all the same, one is different, or two are different. Each of R', R", and R'" is independently selected from the group consisting of hydroxyl, a substituted or unsubstituted (C1–C10) alkyl, a substituted or unsubstituted (C1–C10) hydroxyalkyl, a substituted or unsubstituted (C1–C10) alkyloxy, a substituted or unsubstituted (C1–C10) alkyloxy-(C1–C10) alkyl, a substituted or unsubstituted (C1–C10) alkylamino-(C1–C10) alkyl, a substituted or unsubstituted (C1–C10) aminoalkyl, a substituted or unsubstituted aryl, a substituted or unsubstituted (C1–C10) hydroxyaryl, a substituted or unsubstituted (C1–C10) aryloxy, a substituted or unsubstituted (C1–C10) aminoaryl a substituted or unsubstituted arylalkyl, a substituted or unsubstituted C1–C10 haloalkyl, a substituted or unsubstituted C2–C6 alkenyl, a substituted or unsubstituted C2–C6 alkynyl, oxo, a substituted or unsubstituted (C1–C10) aminoalkyloxy, a substituted or unsubstituted (C1–C10) aminoalkylcarboxy, a substituted or unsubstituted (C1–C10) aminoalkylaminocarbonyl, a substituted or unsubstituted (C1–C10) aminoalkylcarboxamido, or a substituted or unsubstituted (C1–C4)alkylacetamide(C1–C4)alkyloxy (C1–C4)alkyl.

In some embodiments, the resin includes a material having the following substructure (II):

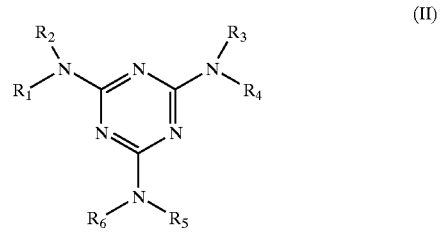

where the $R_1$–$R_6$ groups independently can be all different, all the same, or one or more can the same or different. Each of $R_1$ through $R_6$ is independently selected from the group consisting of hydrogen, hydroxyl, a substituted or unsubstituted (C1–C10) alkyl, a substituted or unsubstituted (C1–C10) hydroxyalkyl, a substituted or unsubstituted (C1–C10) alkyloxy, a substituted or unsubstituted (C1–C10) alkyloxy-(C1–C10) alkyl, a substituted or unsubstituted (C1–C10) alkylamino-(C1–C10) alkyl, a substituted or unsubstituted (C1–C10) aminoalkyl, a substituted or unsubstituted aryl, a substituted or unsubstituted (C1–C10) hydroxyaryl, a substituted or unsubstituted (C1–C10) aryloxy, a substituted or unsubstituted (C1–C10) aminoaryl, a substituted or unsubstituted arylalkyl, a substituted or unsubstituted C1–C10 haloalkyl, a substituted or unsubstituted C2–C6 alkenyl, a substituted or unsubstituted C2–C6 alkynyl, oxo, a substituted or unsubstituted (C1–C10) aminoalkyloxy, a substituted or unsubstituted (C1–C10) aminoalkylcarboxy, a substituted or unsubstituted (C1–C10) aminoalkylaminocarbonyl, a substituted or unsubstituted (C1–C10) aminoalkylcarboxamido, or a substituted or unsubstituted (C1–C4)alkylacetamide(C1–C4)alkyloxy (C1–C4)alkyl.

A preferred resin is melamine (III), shown below (available as Cylink HPC-75, from Cytec). Melamime (III) has both primary alcohol groups and blocked isocyanate groups, which can provide a number of reaction mechanisms that can be used for cross linking. Without wishing to be bound by theory, it is believed that melamine (III) is capable of undergoing an esterification reaction using polycarboxylic acids; a self-condensation that can lead to the creation of polyurethanes; creation of polyurethanes by using isocyanates, e.g., diisocyanates; reaction with polyols leading to the creation of polyurethanes and polyurea; and reaction with amino functional polymers. Another possible mechanism includes the use of a strong acid, such as para-toluene sulfonic acid, which can lead to hydrolysis of the primary alcohol groups and thus increase the rate of the condensation reaction. Other routes are theorized, including protonation of the carbonyl, followed by loss of propanol, and possibly protonation of the nitrogen with reformation of a primary amine, with loss of $CO_2$ and propanol.

It is believed that when the crosslinked melamine (III) is addressed with a laser, thermal decomposition and/or morphological changes occur resulting in a change in refractive index that provides a relatively opaque, white mark.

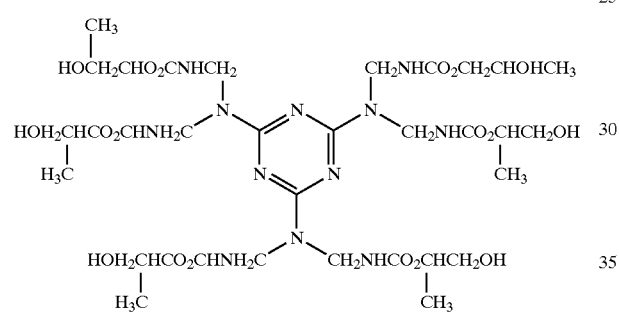
(III)

Other resins include Cymel 1168 (also available from Cytec), which can be used with a catalyst (Cycat 4045), and Cylink TAC monomer.

Other suitable resins include Cymel 303LF (a methylated melamine-formaldehyde resin having alkoxy reactive groups, 98% minimum solids); Cymel 323 (a melamine-formaldehyde resin having imino and alkoxy reactive groups, 80% solids in isobutanol); Cymel 385 (a partially methylated melamine formaldehyde resin having alkoxy, methylol, and imino reactive groups, 79% solids in water); Cymel U-64 (a methylated, high solids urea formaldehyde resin, 90% solids in isopropanol); Cymel 1172 (a glycoluril-formaldehyde resin having methylol reactive groups, 45% solids in water); Cymel 3717 (a high imino, butylated melamine-formaldehyde resin, 82% solids in butanol); Cymel 1168 (a highly alkylated, mixed ether melamine resins, (methylated/isobutylated 1:1 ratio), 98% solids); Cymel 1171 (a methylated-ethylated glycoluril formaldehyde resin, 90% solids minimum in n-butanol); Cymel 1123 (a methylated, ethylated benzoguanamine-formaldehyde resin, 98% solids minimum); Cylink HPC 100 (a hydroxy-functional melamine resin, 100%); and Cylink HPC 75 (a hydroxy-functional melamine resin, 75% solids in water), all available from Cytec Industries (West Paterson, N.J.). Since the glycoluril formaldehyde and the benzoguanamine-formaldehyde resins, after they are crosslinked using a hydroxyl containing polymer and an acid catalyst, are capable of creating an image, it appears that an ether or alkoxy linkage off the nitrogen atom is involved in imaging.

The structures of some the examples are shown below.

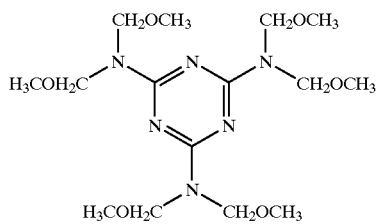
Cymel 303

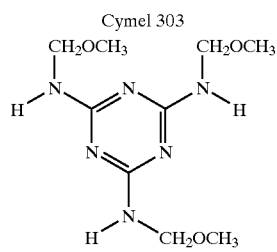
Cymel 385

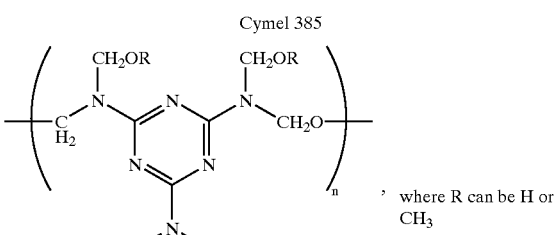
where R can be H or $CH_3$

Cymel 323

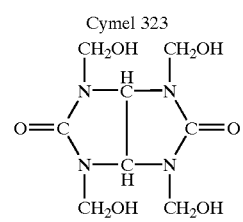
Cymel 1172

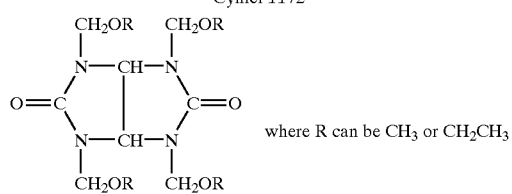
where R can be $CH_3$ or $CH_2CH_3$

Cymel 1171

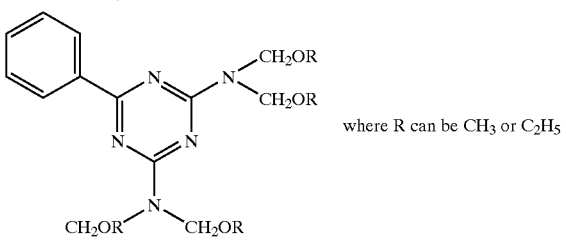
where R can be $CH_3$ or $C_2H_5$

Cymel 1123

Solvent: Generally, the solvent can be any material that can dissolve the resin and other materials in the coating fluid (described below), preferably providing a clear and colorless solution. The solvent is preferably non-toxic, environmentally friendly, e.g., is EPA-approved and does not produce hazardous pollutants, stable with respect to the materials in the coating, and/or cost effective for relatively large scale manufacturing. Examples of solvents include water and polar solvents such as alcohols, e.g., ethanol and propanol. Other solvents can be used.

Crosslinking agent: Examples of crosslinking agents include any mono-functional or multi-functional material that will undergo condensation-type reactions, for example, with the hydroxyl groups on the resin resulting in covalent bridging of the resin through the crosslinking agent. A crosslinking agent can be a polycarboxylic acid, such as oxalic acid, that undergoes an esterification reaction with the resin. A crosslinking agent can be a urethane or an isocyanate, such as diisocyanates, that promotes self-condensation of the resin to form polyurethanes. Another crosslinking agent is a polyol, such as Reactol 100 or Reactol 180, that form polyurethanes and polyureas.

Additive: An additive to the coating fluid can be any material that enhances the properties, e.g., physical and/or mechanical, of the coating. The additive can be a material that increases chain extension and/or that can cross link with the resin. For example, the additive can provide a cured or polymerized coating with improved resistance to tearing, cracking, e.g., upon curing, and/or delamination from a substrate. Preferably, the additive has a stability and solubility in the solvent comparable to other materials (e.g., the resin) in the coating. Preferably, the additive does not discolor or cloud the coating composition.

A preferred additive is a polyol, e.g., a diol and/or a triol. A polyol can crosslink with the resin and/or the crosslinking agent, thereby increasing the flexibility of the cured resin. A cured resin that is flexible can resist mechanical deformation, such as bending and cracking, when the resin is applied to a substrate. The polyol may enhance the properties of the coating compared to a substantially identical coating without the polyol.

Examples of polyols include materials having long carbon chains with hydroxyl termination and/or hydroxyl groups along the backbone, such as 1,2,6-hexanetriol (CAS #106-69-4); materials with long linear or non-linear, e.g., cyclic, carbon backbones with hydroxyl termination (e.g., diols) such as 1,6 hexanediol (CAS #629-11-8) and 1,10-decanediol (CAS #112-47-0); and triols such as Tone 0305 (Union Carbide); Tone 0301 (CAS #37625-56-2, Union Carbide), and glycerol (CAS #56-81-5, Aldrich). Preferably, the polyol includes 1,4 pentanediol (CAS #626-95-9, Aldrich), 1,4 butanediol (CAS #110-63-4, Aldrich). More preferably, the polyol includes caprolactone polyol materials from Union Carbide referred to as the Tone series of polyols, such as, for example, Tone 1270 (CAS #31831-53-5), and Tone 0201 (CAS #36890-68-3). Another example is Reactol 180, an acrylic polyol having primary hydroxyl groups (about 160 hydroxyl groups), available from Lawter International.

The coating may also include a material that enhances opacity such as a pigment or a dye so that, rather than a clear and colorless coating, the coating has a desired background color to enhance contrast of the marked image. For example, if the coating has a pigment that makes the coating black, then the lased marking can appear white against a black background. The pigment or dye is preferably an inert material relative to the coating composition and can tolerate marking conditions, e.g., drying, curing, or laser addressing. Examples of pigments and dyes include carbon black, e.g., for a black background, and azodyes for backgrounds of different colors.

The coating may include a material that enhances the wetting properties of the coating. In some embodiments, the substrate, such as a printed circuit board, can be relatively hydrophobic such that the coating fluid may not coat well, e.g., bead up. To decrease the surface tension energy of the coating fluid, the coating fluid may include a wetting agent such as a surfactant. Examples of surfactants include fluorinated compounds and silicones, such as a polyether-modified dimethyl polysiloxane copolymer (e.g., BYK 333, BYK Chemie).

In some embodiments, the coating fluid includes a "high" polymer having relatively high molecular weight and/or high melting point that can tolerate the energy applied to the coating. An example of a high polymer is a non-aromatic polymer. The coating, including the resin, e.g., melamine, is crosslinked in the presence of the high polymer. Some interpenetrating polymeric networks (IPNs) exhibit phase separation that gives rise to the synergistic properties exhibited by materials in the network. A semi-interpenetrating polymer network is the combination of, for example, two polymers, one cross-linked and one linear, at least one of which was synthesized and/or cross-linked in the presence of the other. Here, the high polymer is selected so that it phase separates in the resin (e.g., melamine) network. For example, when lased, the melamine generates a white marking while the high polymer melts and flows into the voids that remain upon decomposition of the melamine during the lasing event. The reflow of high polymer into the voids would result in an encapsulation of the white marking area by the high polymer, which can impart improved image durability. An example of a semi-IPN is based on styrene-butadiene rubber and polystyrene, which give high impact polystyrene (HIPS).

Catalyst: A catalyst may be added to the coating fluid to increase the rate of polymerization. Increases in polymerization kinetics can be accomplished by adding, for example, acids and conventional urethane catalysts. An example of an acid catalyst is an amine neutralized p-toluene sulfonic acid (Nacure 2500, which has a minimum deblocking temperature of about 65° C. and is available from King Industries, Norwalk, Conn.).

The coating can be applied by several methods such as industrial spraying techniques, lithography, and reciprocal pad printing. The coating can be applied using a drawdown bar, a coating rod, and/or a metered block. The substrate can be metallic (e.g., black powder coated steel (C1010) to provide a contrasting background), glass, polymer (e.g., a polyimide film), ceramic, or any other solid surface. The substrate may be cleaned prior to application of the coating fluid, for example, by a solvent treatment or hydrogen flame treatment. The thickness of the coating is not limited and can be, for example, about 0.5–2 mil thick wet. The coating can have at dry thickness, for example, between about 1–50 microns (e.g., about 10–40 microns, about 15–30 microns, or about 15–25 microns).

The coating fluid can then be further dried, e.g., to further remove solvent, and/or cured or crosslink, e.g., by heating. The curing time and temperature are generally selected to provide a coating that can be addressed with a laser such that a marking is formed. The dried and/or cured coating is preferably robust, e.g., durable (such as like FORMICA®) and/or non-marring. The curing time and temperature can be a function of the composition of the coating, such as the presence of a catalyst or crosslinking agent, the amount of solvent, and the particular resin. The curing time can be, for example, from about less than 1 minute to about 60 minutes. The curing temperature, can be, for example, from room temperature to about 200° C., e.g., 150–200° C. The curing time and/or temperature can be dependent on the presence of a catalyst and/or crosslinking agent.

Irradiating the dried coating with a laser produces a marking or image, e.g., a white marking, on the coating. The coating is preferably sufficiently absorbent at a select wavelength that can induce a color change. Laser irradiation of the coating may be performed using a carbon dioxide laser (e.g., Laserink (10 W) or Synrad (25 W)). The pulse width or dwell (e.g., less than or equal 400 microseconds) can vary, for example, according to the dwell time at each pixel, the coating composition, the substrate, etc. The amount of energy applied by the laser can be less than 10 Watts (e.g., <9 W, <8 W, <7 W, <6 W, <5 W, <4 W, <3 W, <2 W, or <1 W). Other laser conditions can be varied.

Other Embodiments

The coating can be applied to the substrate premixed or as two or more separate solutions, e.g., by a spray gun.

In some embodiments, the coating fluid contains no cross-linking agent, catalyst, and/or additives.

The following examples are illustrative and not intended to be limiting.

EXAMPLE 1

A resin (Cylink HPC-75, 75% solids in water, available from Cytec) was applied to a substrate (a printed circuit board) using a #26 wire bound rod. The coated board was heated at about 200° C. in an oven for about 60 min. The cured film can be stable to at least 400° C.

The coating was addressed with a $CO_2$ laser (Domino DDC-2) at 50 inches per second using a pulse width of 300 microseconds. Areas of the coating addressed with the laser turned opaque white.

For the following examples, the following equipment was used. For lasing, a Fenix laser (from Synrad (Mukilteo, Wash.)) or a Markem SmartLase1 was used. The Fenix laser (Model #FHIN30-80) was a 25 Watt $CO_2$ laser at 10.6$\mu$ wavelength with an FH Series Index Marking Head, 80 mm lens focal length, and a spot size of 116 $\mu$m. The software used was Synrad WinMark Pro, Version #2.0.0.3090 Build 3090. The Markem laser was a 10 Watt $CO_2$ laser with specified settings U.O.S. of 16×10 matrix, 3 spots per pixel, and 150 microsecond dwell time. The software used was Firmware Version:650050B, Build Date of Mar. 22, 2002. For heating, a Blue M oven (Model #DC-146C) was used with a temperature controller (Type: 0931X019). To measure optical density, a MacBeth optical densitometer, The Answer II (Model #PD-922S, 35 Watts, with a measuring range of 0.00–2.50 (white-black)) was used. The densitometer was calibrated to be 0.04 (white) and 1.81 (black).

EXAMPLE 2

The following example studies the relationship between coating thickness and optical density.

A sample including 50% Cylink HPC 100 and 50% ethanol was formed ("Sample 2"). The sample was drawn down on black powder coated plates using Mayer rods (wire wound) of different sizes (#6, #10, #15, #22, and #32). Coatings were cured for 10 minutes at 200° C. Films were addressed by the Fenix laser system using a block pattern that creates a solid area where lased. Laser conditions were: 10% power, 30 inches per second, and 600 dots per inch. Densitometer results are shown in the Table below.

TABLE 1

|  | Rod Size | | | | |
| --- | --- | --- | --- | --- | --- |
|  | 6 | 10 | 15 | 22 | 32 |
| Wet Film thickness (mils) | 0.54 | 0.90 | 1.35 | 1.99 | 2.88 |
| Theoretical dry thickness (mils) | 0.27 | 0.45 | 0.68 | 1.00 | 1.44 |
| Average densitometer readings (n = 6) | 0.502 | 0.323 | 0.332 | 0.262 | 0.257 |
| St. Deviation | 0.243 | 0.033 | 0.031 | 0.010 | 0.014 |
| Null Density | 2.31 | 2.3 | 2.3 | 2.3 | 2.33 |

Coatings created with a #10 rod or greater show highly repeatable results, whereas the #6 rod shows a relatively large standard deviation. There is a slight gain in optical density when the coating thickness is greater than 0.68 mil dry. Starting with coatings formed by the #10 rod and higher, the image is very white.

EXAMPLE 3

The following example examines whether light and/or heat creates a marking.

One-mil wet drawn downs of the sample of Example 2 were made onto black powder coated metal and cured for 10 minutes at 180° C.

Half of the films were heated with a propane torch for 20 seconds and the surface temperature of the film was measured to be in excess of 400° C. There was no white or light areas created for torch heated samples.

Then, all the films were imaged using the SmartLase I, at 100% power and 150 $\mu$s dwell time. All films created white images, suggesting that there was no degradation from the heating process.

Then, one image from the heated and non-heated samples was heated using the propane torch as described above, by passing the flame over the image. The white images were not degraded by reheating.

EXAMPLE 4

The following example studies the amount of energy needed to create a white mark.

First, the laser system was calibrated to define laser operating conditions in terms of a power unit (e.g., J/sec). Three data points were taken by varying the operating output of the FENIX laser to evaluate whether the output was linear. The data points and measured outputs are shown in the Table below.

TABLE 2

| % Power | Joules/second |
| --- | --- |
| 10 | 2.8 |
| 50 | 16.3 |
| 100 | 28.4 |

The results were plotted, and using linear regression, a generally straight line was derived: y=0.2923x, $R^2$=0.9892, where y is the measured energy (Joules/second) and x is the power.

Then, one-mil wet draw downs of the sample in Example 2 were made on black powder coated aluminum coupons. The coatings were cured at 200° C. for 10 minutes. The coatings were then addressed by the FENIX laser system at a variety of percent power conditions.

The minimum power that appears to give a consistent mark is about 6%. According to the equation above (y=0.2923x), 6% power is approximately 1.8 Joules/second, or 1.8 watts.

EXAMPLE 5

The following example examines the effect of curing on the creation of white images.

A #14 Mayer rod was used to coat the sample of Example 2 on a black powder coated substrate. One of the coatings was cured at 200° C. for 10 minutes, and the other was allowed to air dry. Both were addressed by the Synrad laser, at 10% power, 30 inches per second, and 600 dots per inch. Only the cured coating created an opaque mark.

EXAMPLE 6

The following example evaluates the effectiveness of an amino resin as a crosslinker for the HPC resin. According to the literature, this will form urethane-polyether crosslinked networks. Sample 2 is the sample from Example 2.

TABLE 3

| | All Gram Weights | | | | |
|---|---|---|---|---|---|
| | A | B | C | D | Control |
| Sample 2 | 8.0 | 6.0 | 4.0 | 2.0 | |
| Cymel 303LF | 2.0 | 4.0 | 6.0 | 8.0 | 10 |
| Nacure 2500 | 0.3 | 0.3 | 0.3 | 0.3 | 0.3 |

Materials were weighed out into a 1 oz. polypropylene jar and hand mixed. A one-mil draw down bar was used to coat the fluids on black powder coated metal. Films were cured at 200, 175, and 150° C. for 10 minutes. Films were evaluated for cure by an acetone rub test, which includes ten double rubs using a cotton tipped applicator. None of the films showed deterioration.

Cured films were addressed by the Smartlase laser at the following conditions: 100% power, 150 µs dwell time, 16×10 matrix, and 3 spots/pixel. As viewed through a microscope, there was no clear trend in the results. There may have been a variation in film thickness that is contributing to this effect. Also, the lasing conditions, such as the power and dwell time, may not have been optimized. Sample D was more white than both samples C and E.

EXAMPLE 7

The following example evaluates low temperature curing.

Using the samples from Example 6, draw downs were made onto powder coated aluminum coupons at 1 mil wet film thickness. The samples were cured at 125° C. and 100° C. for 10 minutes. Evaluations of cross linking were done by acetone rub tests.

Films cured at 125° C. were not deteriorated by the solvent wipe test. All films were removed when cured at 100° C. Sample E was tacky at 100° C.

All films were addressed by the Smartlase laser at 100% power, 150 µs dwell time, 3 spots/pixel, and 16×10 matrix. All films showed an opaque white mark, except Sample E cured at 100° C.

EXAMPLE 8

The following example studies Cymel 323 as a crosslinker for the HPC resin.

TABLE 4

| | All Gram Weights | | | | |
|---|---|---|---|---|---|
| | A | B | C | D | Control |
| Sample 2 | 8.0 | 6.0 | 4.0 | 2.0 | |
| Cymel 323 | 2.0 | 4.0 | 6.0 | 8.0 | 10 |

Materials were weighed out into scintillation vials and hand mixed. Fluids were then drawn down using a one-mil draw down bar onto black powder coated metal. Samples were cured at 200° C. for 10 minutes and evaluated for crosslinking by the acetone rub test (ten double rubs). There was no visible degradation on any sample.

Films were addressed by the Smartlase laser at various conditions to create a white image. Samples C, D, and E showed prints that were more white than Samples A and B. Sample E showed dewetting along the surface.

EXAMPLE 9

The following example evaluates mixtures of Cylink HPC-75 (75% HPC in 25% water) and Cymel 385.

TABLE 5

| | All Gram Weights | | | | |
|---|---|---|---|---|---|
| | A | B | C | D | Control |
| Cylink HPC-75 | 8.0 | 6.0 | 4.0 | 2.0 | |
| Cymel 385 | 2.0 | 4.0 | 6.0 | 8.0 | 10 |

One-mil draw downs of each sample were made on black powder coated coupons and cured at 200° C. for 10 minutes. Samples were tested for cure by the acetone rub test (ten double rubs). None of the films deteriorated.

Films were addressed by the Smartlase at various % power (as low as 40%), 150 µs dwell time, 16×10 matrix, and 3 spots/pixel. Samples D and E gave the best results.

EXAMPLE 10

The following example evaluates Cymel U-64 as a material that can create a white mark when addressed by a laser.

A sample fluid was prepared containing five grams of Cymel U-64 and 0.2 gram Nacure 2500. A one-mil draw down bar was used to coat the fluid on black powder coated metal, and the coatings were cured for 10 minutes at 200° C. Films were evaluated for cure by using the acetone rub test. The films showed no deterioration.

The films were imaged using the Smartlase at 40% power, 150 µs dwell time, 16×10 matrix, and 3 spots/pixel. Opaque white images were created.

The images were subjected to acetone and MEK rub tests (50 double rubs with a cotton tipped applicator). There was no visible deterioration to the images.

Also, films were cast as before and cured at 150° C. and 125° C. for 10 minutes and 40 minutes. (The films at 125° C. did not fully cure in 10 minutes.) Films were then tested and showed acetone resistance.

Images were created as described above and tested as above. The images showed no deterioration from the solvent rubs.

EXAMPLE 11

The following example evaluates Cymel 1172 as a material that can create a white mark when addressed by a laser. Cymel 1172 is a tetramethylol glycoluril-formaldehyde resin that can crosslink hydroxyl functional polymers. In some cases, Cymel 1172 may need a strong acid catalyst (such as p-TSA) to crosslink.

Initial attempts to draw down the fluid onto black powder coated films showed heavy dewetting. Heating the fluid to remove excess water allowed for a film to be coated onto the metal. The fluid included 5.0 grams of solvent stripped resin and 0.2 grams of Nacure 2500. Coating were heated for 10 minutes at 150° C. and were not cured when removed. Films were imaged using the Smartlase at 30% power, 150 μs dwell time, and 16×10 matrix. An opaque white image was formed.

EXAMPLE 12

The following example evaluates Cymel 3717 as a material that can create a white mark when addressed by a laser.

Five grams of Cymel 3717 and 0.2 grams of Nacure 2500 were hand mixed together and applied to black powder coated metal using a one-mil draw down bar. The films were then cured at 200° C. for 10 minutes. The films showed heavy dewetting. The films were then addressed by a $CO_2$ laser (Smartlase) at conditions as low as 30% power, 150 μs dwell time, 16×10 matrix, and 3 spots/pixel. White images were created.

EXAMPLE 13

The following example studies the effect of the substrate in using Cylink HPC resin. The fluid was the same as Sample 2 from above.

A one-mil draw down bar was used to coat the fluid onto black powder coated steel (1010 steel), glass, and polyimide film. The films were cured at 175° C. for 10 minutes and then imaged using a Smartlase 1 at 40% power, 150 μs dwell time, 16×10 matrix, and 3 spots/pixel. All substrates showed opaque images with similar characteristics.

EXAMPLE 14

The following example studies the addition of pigments or dyes into an imaging fluid so that a white image can be created on a colored background.

Ten grams of Sample 2 and 0.2 gram of Warner Jenkenson F, D, and C Red #40 lake were weighed out into a scintillation vial and hand shaken to provide a dispersion. A film was cast by drawing the fluid down by hand onto a glass microscope slide until an opaque film thickness was reached. The film was cured for 10 minutes at 175° C. and imaged using a Smartlase 1 at 40% power, 150 μs dwell time, 16×10 matrix, and 3 spots/pixel. An opaque white image was created on a colored background.

EXAMPLE 15

The following example evaluates Cymel 1171 as a material that can create a white mark when addressed by a laser.

Early evaluations showed that Cymel 1171 needed to be crosslinked via hydroxyl groups or other methods. A solution ("Sample 15") containing 100 grams of ethanol, 25 grams of isopropyl alcohol, and 100 grams of Reactol 180 was prepared. Then, five grams of Sample 15, five grams of Cymel 1171, and 0.2 gram of Nacure 2500 was used to assess the crosslinking of the film. The materials were dissolved in using a cowles blade, and approximately 90% of the materials dissolved after 30 minutes.

Hand draw downs were made (thick films) onto black powder coated steel and cured for 10 minutes at 200° C. Samples were imaged using the Smartlase 1 at 40–50% power, 150 μs dwell time, 16×10 matrix, and 3 spots/pixel. Opaque white images were created.

EXAMPLE 16

The following example evaluates Cymel 1123 as a material that can create a white mark when addressed by a laser.

Five grams of Sample 15, five grams of Cymel 1123, and 0.2 gram of Nacure 2500 were weighed out into a scintillation vial and hand shaken to provide mixing. One-mil wet drawdowns were made onto black powder coated metal coupons and cured at 200° C. for 10 minutes. Coatings were evaluated for crosslinking via the acetone rub test. No deterioration was seen to the film.

Images were made using the Smartlase 1 at 50% power, 16×10 matrix, 150 μs dwell time, and 3 spots/pixel. Opaque white images were made.

As a control, a sample containing five grams of Sample 15 and 0.2 gram of Nacure 2500 was prepared to check that the white image created was not a result of the polyol. Materials were weighed out and hand shaken in a scintillation vial. Films were cast onto black powder coated steel (one mil and greater) and cured at 200° C. for 10 minutes. Films were evaluated for crosslinking by the acetone rub test. The films were dissolved away.

The films were addressed by the Smartlase 1 at various conditions (power, dwell) to create a white image. No image was created.

All publications, patents, applications, and references referred to herein are incorporated by reference in their entirety.

Other embodiments are within the claims.

What is claimed is:

1. A method of marking a substrate, comprising:
   contacting the substrate with a composition comprising a material with a substructure

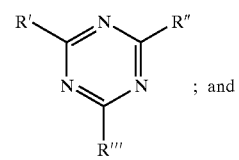
; and contacting the composition with energy sufficient to produce a a white mark in the composition,
   wherein each of R', R", and R'" is independently selected from the group consisting of hydroxyl, a substituted or unsubstituted (C1–C10) alkyl, a substituted or unsubstituted (C1–C10) hydroxyalkyl, a substituted or unsubstituted (C1–C10) alkyloxy, a substituted or unsubstituted (C1–C10) alkyloxy-(C1–C10) alkyl, a substituted or unsubstituted (C1–C10) alkylamino-(C1–C10) alkyl, a substituted or unsubstituted (C1–C10) aminoalkyl, a substituted or unsubstituted aryl, a substituted or unsubstituted (C1–C10) hydroxyaryl, a substituted or unsubstituted (C1–C10) aryloxy, a substituted or unsubstituted (C1–C10) aminoaryl, a substituted or unsubstituted arylalkyl, a substituted or unsubstituted C1–C10 haloalkyl, a substituted or unsubstituted C2–C6 alkenyl, a substituted or unsubstituted C2–C6 alkynyl, oxo, a substituted or unsubstituted (C1–C10) aminoalkyloxy, a substituted or unsubstituted (C1–C10) aminoalkylcarboxy, a substituted or unsubstituted (C1–C10) aminoalkylaminocarbonyl, a substituted or unsubstituted (C1–C10) aminoalkylcarboxamido, and a substituted or unsubstituted (C1–C4)alkylacetamide(C1–C4)alkyloxy(C1–C4)alkyl.

2. The method of claim 1, wherein the composition further comprises a crosslinking agent.

3. The method of claim 1, wherein the composition further comprises a catalyst.

4. The method of claim 1, wherein the composition further comprises a pigment.

5. The method of claim 1, wherein the composition further comprises a polyol.

6. The method of claim 1, wherein the energy is delivered from a laser.

7. The method of claim 1, further comprising heating the composition.

8. The method of claim 1, further comprising curing the composition.

9. The method of claim 1, comprising contacting the composition with energy without previously curing the composition.

10. The method of claim 1, comprising contacting the composition with energy without previously heating the composition.

11. The method of claim 1, wherein the white mark has an optical density less than about 0.5.

12. The method of claim 1, wherein the white mark has an optical density less than about 0.3.

13. A method of marking a substrate, comprising:

contacting the substrate with a composition having a material with a substructure

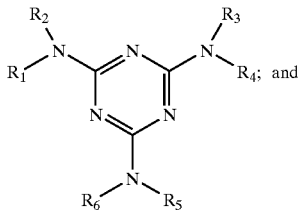

contacting the composition with energy sufficient to produce a a white mark in the composition, wherein each of $R_1$ through $R_6$ is independently selected from the group consisting of hydrogen, hydroxyl, a substituted or unsubstituted (C1–C10) alkyl, a substituted or unsubstituted (C1–C10) hydroxyalkyl, a substituted or unsubstituted (C1–C10) alkyloxy, a substituted or unsubstituted (C1–C10) alkyloxy-(C1–C10) alkyl, a substituted or unsubstituted (C1–C10) alkylamino-(C1–C10) alkyl, a substituted or unsubstituted (C1–C10) aminoalkyl, a substituted or unsubstituted aryl, a substituted or unsubstituted (C1–C10) hydroxyaryl, a substituted or unsubstituted (C1–C10) aryloxy, a substituted or unsubstituted (C1–C10) aminoaryl, a substituted or unsubstituted arylalkyl, a substituted or unsubstituted C1–C10 haloalkyl, a substituted or unsubstituted C2–C6 alkenyl, a substituted or unsubstituted C2–C6 alkynyl, oxo, a substituted or unsubstituted (C1–C10) aminoalkyloxy, a substituted or unsubstituted (C1–C10) aminoalkylcarboxy, a substituted or unsubstituted (C1–C10) aminoalkylaminocarbonyl, a substituted or unsubstituted (C1–C10) aminoalkylcarboxamido, or a substituted or unsubstituted (C1–C4)alkylacetamide(C1–C4)alkyloxy(C1–C4)alkyl.

14. The method of claim 13, wherein the composition further comprises a crosslinking agent.

15. The method of claim 13, wherein the composition further comprises a catalyst.

16. The method of claim 13, wherein the composition further comprises a pigment.

17. The method of claim 13, wherein the composition further comprises a polyol.

18. The method of claim 13, wherein the energy is delivered from a laser.

19. The method of claim 13, further comprising heating the composition.

20. The method of claim 13, further comprising curing the composition.

21. The method of claim 13, comprising contacting the composition with energy without previously curing the composition.

22. The method of claim 13, comprising contacting the composition with energy without previously heating the composition.

23. The method of claim 13, wherein the white mark has an optical density less than about 0.5.

24. The method of claim 13, wherein the white mark has an optical density less than about 0.3.

25. A method of marking a substrate, comprising:

contacting the substrate with a composition comprising a material with a substructure

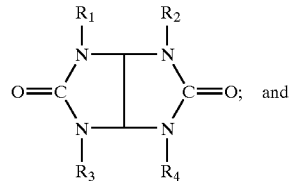

contacting the composition with energy sufficient to produce a a white mark in the composition, wherein each of $R_1$ through $R_4$ is independently selected from the group consisting of hydroxyl, a substituted or unsubstituted (C1–C10) alkyl, a substituted or unsubstituted (C1–C10) hydroxyalkyl, a substituted or unsubstituted (C1–C10) alkyloxy, a substituted or unsubstituted (C1–C10) alkyloxy-(C1–C10) alkyl, a substituted or unsubstituted (C1–C10) alkylamino-(C1–C10) alkyl, a substituted or unsubstituted (C1–C10) aminoalkyl, a substituted or unsubstituted aryl, a substituted or unsubstituted (C1–C10) hydroxyaryl, a substituted or unsubstituted (C1–C10) aryloxy, a substituted or unsubstituted (C1–C10) aminoaryl, a substituted or unsubstituted arylalkyl, a substituted or unsubstituted C1–C10 haloalkyl, a substituted or unsubstituted C2–C6 alkenyl, a substituted or unsubstituted C2–C6 alkynyl, oxo, a substituted or unsubstituted (C1–C10) aminoalkyloxy, a substituted or unsubstituted (C1–C10) aminoalkylcarboxy, a substituted or unsubstituted (C1–C10) aminoalkylaminocarbonyl, a substituted or unsubstituted (C1–C10) aminoalkylcarboxamido, and a substituted or unsubstituted (C1–C4)alkylacetamide(C1–C4)alkyloxy(C1–C4)alkyl.

26. The method of claim 25, wherein the composition further comprises a crosslinking agent.

27. The method of claim 25, wherein the composition further comprises a catalyst.

28. The method of claim 25, wherein the composition further comprises a pigment.

29. The method of claim 25, wherein the composition further comprises a polyol.

30. The method of claim 25, wherein the energy is delivered from a laser.

31. The method of claim 25, further comprising heating the composition.

32. The method of claim 25, further comprising curing the composition.

33. The method of claim 25, comprising contacting the composition with energy without previously curing the composition.

34. The method of claim 25, comprising contacting the composition with energy without previously heating the composition.

35. The method of claim 25, wherein the white mark has an optical density less than about 0.5.

36. The method of claim 25, wherein the white mark has an optical density less than about 0.3.

* * * * *